US010613955B2

(12) United States Patent
Pappu et al.

(10) Patent No.: US 10,613,955 B2
(45) Date of Patent: Apr. 7, 2020

(54) PLATFORM DEBUG AND TESTING WITH SECURED HARDWARE

(71) Applicant: Intel Corporation, Santa Clara, CA (US)

(72) Inventors: Lakshminarayana Pappu, Folsom, CA (US); Navneet Dour, El Dorado Hills, CA (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 15/857,535

(22) Filed: Dec. 28, 2017

(65) Prior Publication Data
US 2019/0042382 A1 Feb. 7, 2019

(51) Int. Cl.
| | | |
|---|---|---|
| *G06F 1/26* | (2006.01) | |
| *G06F 11/273* | (2006.01) | |
| *G06F 9/448* | (2018.01) | |
| *G06F 11/27* | (2006.01) | |
| *G06F 11/26* | (2006.01) | |
| *G11C 29/56* | (2006.01) | |
| *G11C 29/02* | (2006.01) | |
| *G06F 1/3203* | (2019.01) | |

(52) U.S. Cl.
CPC ........ *G06F 11/2733* (2013.01); *G06F 9/4498* (2018.02); *G06F 11/26* (2013.01); *G06F 11/27* (2013.01); *G06F 11/2736* (2013.01); *G11C 29/022* (2013.01); *G11C 29/56* (2013.01); *G06F 1/3203* (2013.01)

(58) Field of Classification Search
CPC .... G06F 11/2733; G06F 9/4498; G06F 11/27; G06F 11/2736
USPC .......................................... 713/300
See application file for complete search history.

(56) References Cited

U.S. PATENT DOCUMENTS

| | | | | |
|---|---|---|---|---|
| 6,888,367 | B1 * | 5/2005 | Nguyen | G01R 31/31723 324/762.01 |
| 8,046,571 | B1 * | 10/2011 | Feng | G06F 21/575 713/1 |
| 8,549,368 | B1 * | 10/2013 | Deogharia | G06F 11/27 714/30 |
| 8,607,036 | B2 * | 12/2013 | More | G06F 9/4401 713/1 |
| 9,404,969 | B1 * | 8/2016 | Keller | G01R 31/31703 |
| 2005/0204226 | A1 * | 9/2005 | Whetsel | G01R 31/3177 714/726 |
| 2008/0016395 | A1 * | 1/2008 | Feng | G01R 31/31719 714/27 |
| 2008/0208384 | A1 * | 8/2008 | McCarthy | G01R 31/31723 700/121 |
| 2008/0320277 | A1 * | 12/2008 | Fish, III | G06F 9/30032 712/28 |

(Continued)

*Primary Examiner* — Volvick Derose
(74) *Attorney, Agent, or Firm* — Compass IP Law PC (57) ABSTRACT

A system includes test control circuitry in parallel with power control circuitry. The power control circuitry enables a core processor and memory interface drivers responsive to a reset. The test control circuitry can enable the memory interface drivers separately from the core processor to enable testing of the connections to the memory devices. The test control circuitry is triggered separately from the other power control circuitry, and can be protected to allow only secured access for testing.

20 Claims, 7 Drawing Sheets

(56) References Cited

U.S. PATENT DOCUMENTS

| | | | |
|---|---|---|---|
| 2009/0204779 A1* | 8/2009 | Khan | G01R 31/31719 711/166 |
| 2009/0222652 A1* | 9/2009 | Khan | G06F 12/1433 713/2 |
| 2009/0296933 A1* | 12/2009 | Akselrod | G01R 31/31719 380/277 |
| 2014/0089492 A1* | 3/2014 | Nelson | H04L 67/325 709/224 |
| 2014/0278199 A1* | 9/2014 | Rajagopal | G06F 11/3668 702/122 |
| 2016/0085559 A1* | 3/2016 | Todd | G06F 9/4403 713/1 |
| 2017/0053111 A1* | 2/2017 | Stewart | G06F 8/654 |
| 2017/0109175 A1* | 4/2017 | Angaluri | G06F 9/4416 |

* cited by examiner

PLATFORM DEBUG AND TESTING WITH SECURED HARDWARE

FIELD

Descriptions are generally related to device testing, and more particular descriptions are related to testing control provided by hardware parallel to traditional power control hardware.

BACKGROUND

Original equipment manufacturers (OEMs) manufacture computing systems on a board using components from multiple sources. The OEMs need to test the entire board to determine if there are shorts or crossed wires (such as shorts to the high voltage source (VDD), shorts to system ground (GND), or shorts among signals). Testing the entire board with components loaded may result in difficulty determining if a test failure is a result of a component error or a board error.

Traditional board testing of connections to main memory (e.g., to dynamic random access memory (DRAM) devices or dual inline memory modules (DIMMs)) requires turning on all input/output (I/O) interface connections to perform the testing. Thus, there is traditionally a dependency problem in OEM board-level testing, because the I/O to the memory would typically not be enabled until the processor is enabled for testing, but the processor would require access to memory to perform its testing. Thus, the I/O to communicate with the memory does not get enabled until after the memory is supposed to be tested.

One traditional way to address the OEM board level testing is to require the memory devices and memory controller to come out of reset early enough to be able to perform testing for opens/shorts and lumped capacitance effects before the "booting" stage initiates. Bringing the memory subsystem out of reset early ensures that OEMs can detect board level faults, I/O connectivity issues to the memory, and any defects in memory's basic functionality before the memory reference code (MRC) commences. The early memory subsystem testing is traditionally performed with low speed (relative to the access speed of memory in active operation) testing sequences. The low speed sequences involve the sending of test codes through testing connectors to the memory components.

The platform testing with early exit from reset can add significant time to the testing procedure and violate testing goals for the OEMs. With an increased focus on power management in emerging products, platforms have incorporated elaborate embedded power gating and reset control mechanisms to meet the platform power requirements. With the platform gating and reset control, the testing requires external customers to complete the reset sequence for checking the I/O connectivity to the memory. Such a requirement on the external customer violates OEM requirements for testing the on-board memory I/O with minimal reset. Additionally, it increases internal test times for high volume manufacturing (HVM) up to several seconds, resulting in increased test time cost.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a system includes test control circuitry in parallel with power control circuitry. With a platform that has embedded power gating and reset control, the parallel test control circuitry can enable the memory interface drivers separately from the core processor to enable testing of the connections to the memory devices. The embedded gating and reset control can be or be part of the power control circuitry that enables a core processor and memory interface drivers in conjunction with enabling the core processor. The test control circuitry is triggered separately from the embedded power control circuitry. In one example, the test control circuitry is protected for secured access for testing.

With the parallel test control circuitry enabling the memory input/output (I/O) interfaces separately from the core, the test control circuitry enables the testing of the memory interfaces separately from powering up the platform core processor. As a result, the testing can be performed more quickly as compared to traditional test times for high volume manufacturing (HVM), which decreases test time cost.

The testing control circuitry allows the memory I/O to be enabled separately from the core, which allows the testing to occur in a way that preserves the dependency between the testing of the memory and the booting of the core processor. With the testing control circuitry the OEM (original equipment manufacturer) can detect board level opens or shorts (e.g., shorts to VDD, shorts to GND, or shorts among signals) or lumped capacitance effects before the booting stage initiates. Instead of writing hundreds of lines of code through a slow testing interface as traditionally done, which is cumbersome and error prone, the system can bring up the memory I/O interface to test the memory subsystem.

Figure 1:
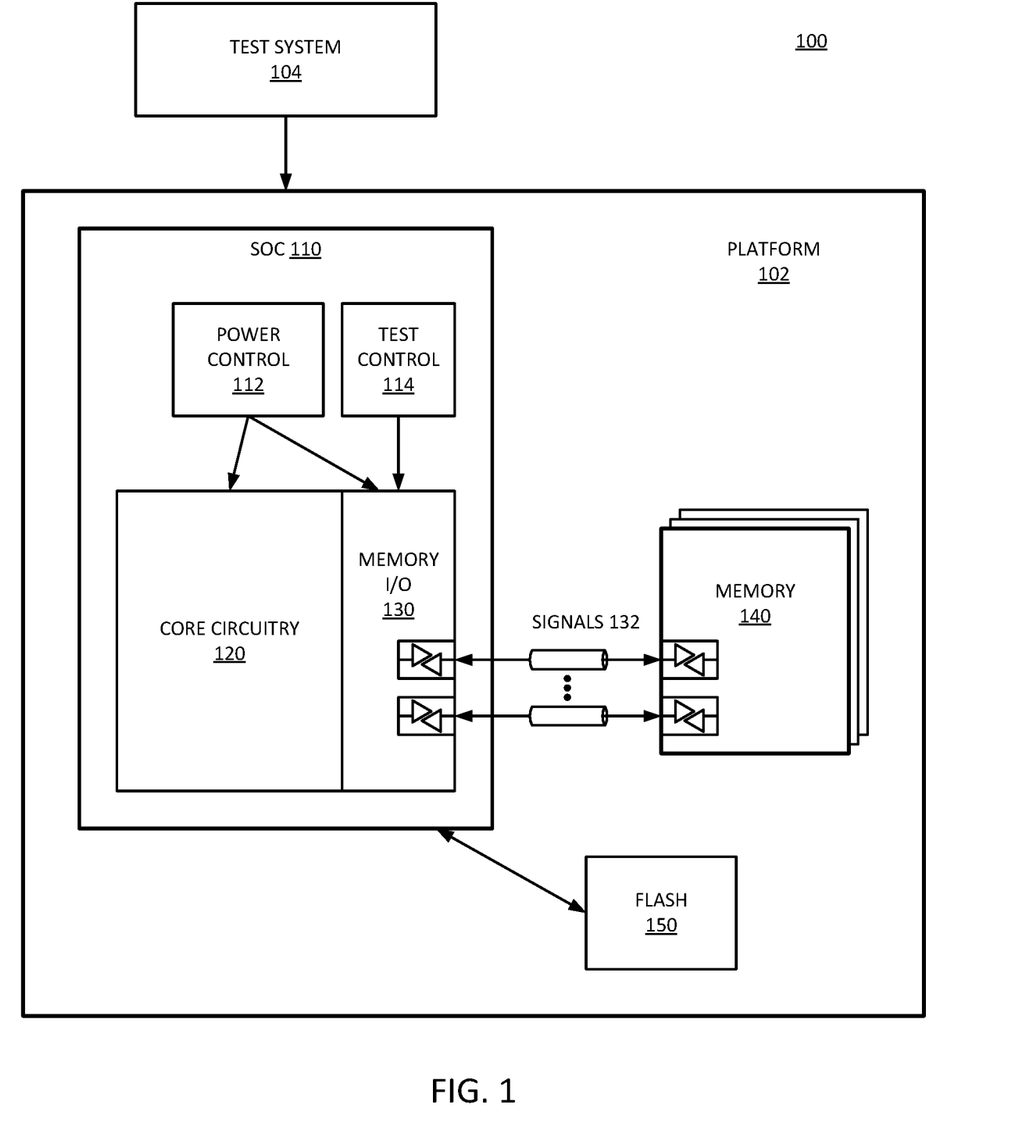
FIG. 1 is a block diagram of an example of a system with test control circuitry to enable a memory interface in addition to power control circuitry that enables the core and the memory interface.

FIG. 1 is a block diagram of an example of a system with test control circuitry to enable a memory interface in addition to power control circuitry that enables the core and the memory interface. System 100 represents a test system for a computing device platform. Platform 102 represents a computing system platform on which an OEM incorporates multiple different components. The OEM can test platform 102 with test system 104. Test system 104 represents a system including hardware devices to connect to platform 102 and provide test input. Platform 102 can be a computer platform for a desktop computer, laptop, tablet, or server.

In one example, platform 102 includes system on a chip (SOC) 110, which represents components integrated together on a common substrate. In one example, platform 102 is a printed circuit board (PCB). The common substrate of SOC 110 can be a common integrated circuit (I/C). In one example, SOC 110 is a multichip package. In one example, SOC 110 can be a silicon substrate. SOC 110 connects the components of the SOC together, including one or more processor components.

Core circuitry 120 includes processor circuitry and drivers. Memory I/O 130 represents drivers and interface circuitry to couple to memory 140. In one example, core circuitry 120 includes multiple cores or multiple processor cores. In one example, core circuitry 120 can include graphics circuitry and drive units, such a graphics processing unit (GPU). Memory I/O 130 includes transmit and receive circuitry to interface with or couple to memory 140. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data. Memory I/O 130 can be elements of a memory controller or control logic that generates memory access commands in response to the execution of operations by the processor cores, and controls access to memory 140.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. One example of volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015, DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications. Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory. In one example, memory I/O 130 can be referred to as DDR I/O.

In one example, memory I/O 130 couples to memory 140 via a memory bus, which can include one or more memory channels to couple to DRAM devices or dual inline memory modules (DIMMs). Signals 132 represent the memory bus or other connections to memory 140. In one example, memory I/O 130 and signals 132 can be or include pins, pads, connectors, signal lines, traces, or wires, or other hardware to connect the devices, or a combination of these. Memory I/O 130 includes at least drivers/transceivers for signal lines. Commonly, wires within an integrated circuit interface couple with a pad, pin, or connector to interface signal lines or traces or other wires between devices. Signals 132 for the memory I/O 130 can include a "C/A bus" (or ADD/CMD bus, or some other designation indicating the transfer of commands (C or CMD) and address (A or ADD) information). In one example, signals 132 can include signal lines for write and read DQ (data) can be referred to as a "data bus."

SOC 110 includes power control circuitry 112 to control the enabling and operation of core circuitry 120 and memory I/O 130. Control circuitry 112 can represent embedded power gating and reset control mechanisms for SOC 110. In one example, test control 114 provides parallel control logic to enable memory I/O 130. Power control circuitry 112 enables core circuitry 120 and memory I/O 130 for the functioning of SOC 110. Test system 104 can provide signals to test the functionality of the interface between memory I/O 130 and memory 140. The operation and control of test control circuitry 114 can be in accordance with what is set out below. Test control circuitry 114 selectively enables memory I/O 130 in response to one or more signals for purposes of testing platform 102.

In one example, platform 102 includes flash 150. Flash 150 can be or include storage to store a basic input/output system (BIOS). The BIOS stores boot sequence information and configuration information for the runtime operation of core circuitry 120. In one example, test control 114 can activate memory I/O 130 prior to enablement of core circuitry 120 and prior to boot initiation of BIOS from flash 150.

Figure 2A:
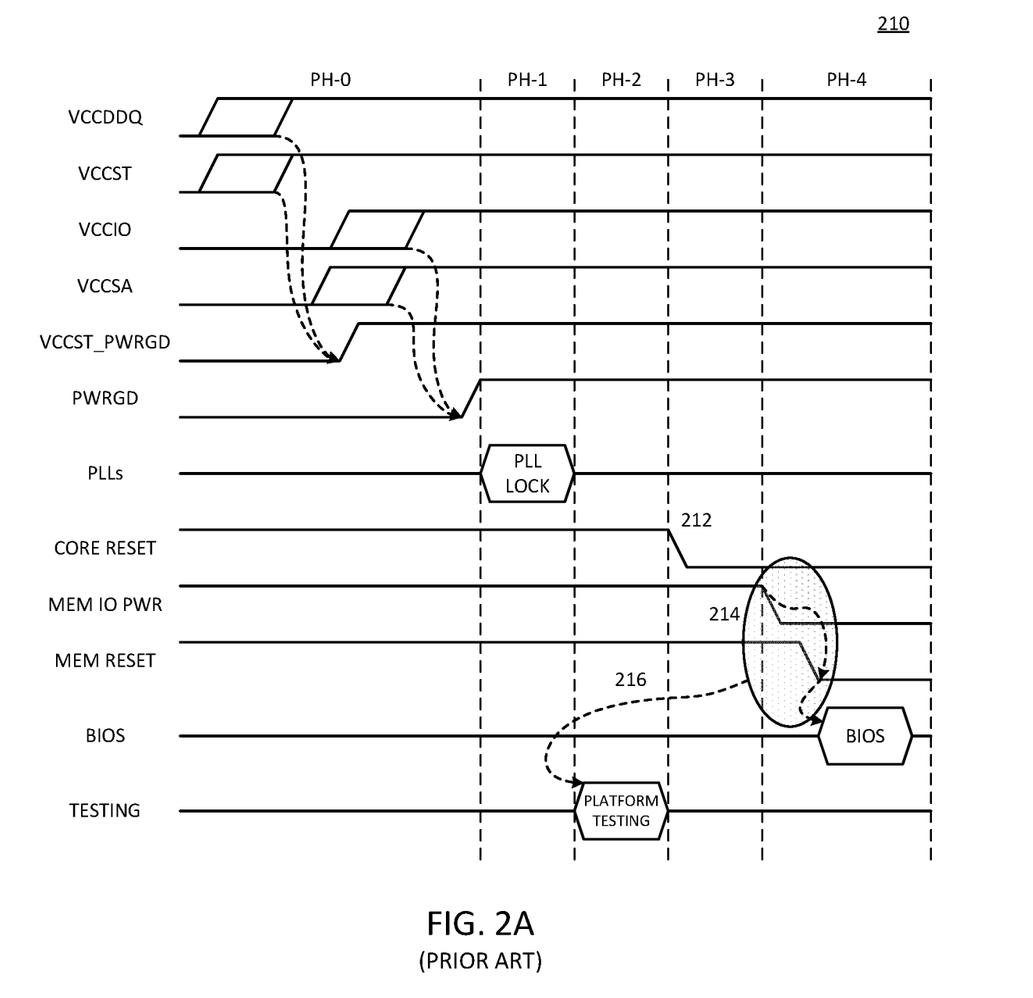
FIG. 2A is a timing diagram of an example of conventional memory I/O testing.

FIG. 2A is a timing diagram of an example of conventional memory I/O testing. Diagram 210 illustrates conventional I/O testing operation flow, with testing phases PH-0 to PH-4. Diagram 210 illustrates a broken SOC reset sequence for OEM board level testing, with memory testing occurring after testing of the platform, where platform testing occurs prior to memory I/O testing. The platform testing can be more efficiently performed after the memory I/O testing has already occurred.

Diagram 210 provides an overview of a high level SOC reset sequence with various power rails and resets to bring the system up for testing. VCCDDQ (VCC-DDR) and VCCST (VCC-Sustain) represent power rails in the SOC, and the parallelogram represents the transition and hold time of the power rail. In response to a transitioning on or bringing up of these rails in Phase-0 (PH-0), signal VCCST_PWRGD which indicates that the VCCST power rail is ready. VCCIO (input/output voltage power-up) and VCCSA (system agent power rail) are additional SOC power rails. In response to the transitioning on of these rails in Phase-0, signal PWRGD can indicate that the power levels are good.

Once the power levels are good, the testing transitions to Phase-1 (PH-1). In Phase-1, phase lock loop components (PLLs) lock.

In Phase-2 (PH-2), the test system performs platform testing. In Phase-3 (PH-3), as illustrated at 212, the cores come out of reset. In Phase-4 (PH-4), shaded area 214 illustrates how the memory I/O power (MEM IO PWR) occurs followed by the memory reset. The BIOS representation in Phase-4 represents microcode execution to perform system testing and initiation.

In diagram 210, the system disables the power gates on the memory I/O (e.g., DDR) to bring the memory out of reset, followed by BIOS training of the memory interface. Board testing/debug and HVM (high volume manufacturing) testing is supposed to happen in Phase-2 of diagram 210, which is after the memory subsystem is brought out of reset. Thus, as described above, the memory subsystem may need to be brought out early and testing performed with less efficient operations. The arrow at 216 illustrates the out of order nature of the testing of diagram 210. The memory I/O testing cannot occur earlier because the logic that controls the memory I/O gating also controls the gating of the cores, and will also bring the SOC core online if the memory I/O is ungated.

Figure 2B:
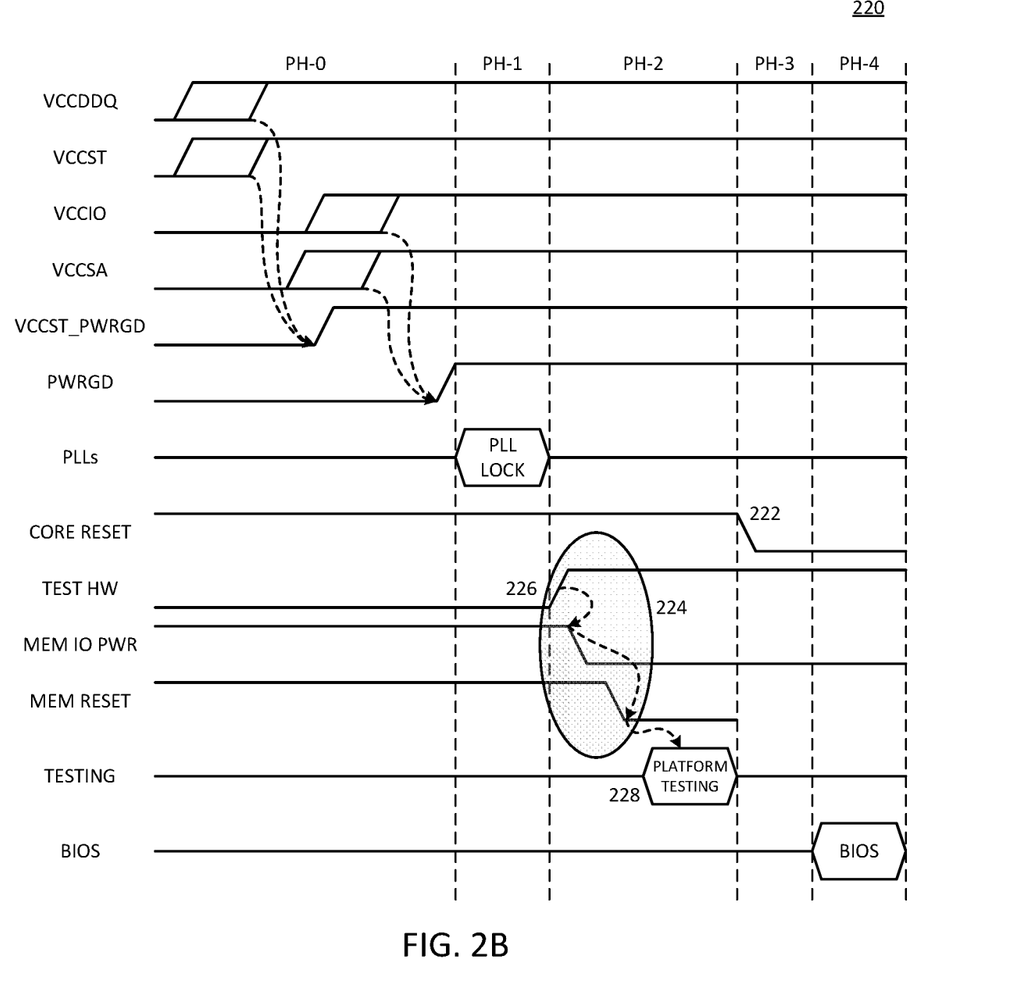
FIG. 2B is a timing diagram of an example of memory I/O testing in accordance with parallel control circuitry.

FIG. 2B is a timing diagram of an example of memory I/O testing in accordance with parallel control circuitry. Diagram 220 illustrates an I/O testing operation flow where parallel logic can enable the memory I/O separately from the core. System 100 of FIG. 1 provides an example of a system that can execute the testing operation flow of diagram 220. Diagram 220 has testing phases PH-0 to PH-4 similar to diagram 210, but has different operation order.

Similar to diagram 210, diagram 220 provides an overview of a high level SOC reset sequence with various power rails and resets to bring the system up for testing. VCCDDQ (VCC-DDR) and VCCST (VCC-Sustain) represent power rails in the SOC, and the parallelogram represents the transition and hold time of the power rail. In response to a transitioning on or bringing up of these rails in Phase-0 (PH-0), signal VCCST_PWRGD which indicates that the VCCST power rail is ready. VCCIO (input/output voltage power-up) and VCCSA (system agent power rail) are additional SOC power rails. In response to the transitioning on of these rails in Phase-0, signal PWRGD can indicate that the power levels are good. Once the power levels are good, the testing transitions to Phase-1 (PH-1). In Phase-1, phase lock loop components (PLLs) lock.

In one example, power to the components will be initially gated, and the system selectively opens the power gates during the appropriate reset sequence phases. The selective opening achieves lower power usage on the system than having everything come on at once and stay on the whole time. In addition to improving power usage, the testing in accordance with diagram 220 can enable more efficient testing of the board-level connections.

In Phase-2 (PH-2), in one example, the test system performs platform testing. Prior to platform testing, in one example, the system includes test hardware that is initiated at 226. The test hardware includes parallel control logic as referred to in other portions of the description. Shaded area 224 illustrates that the initiation of the test hardware enables the memory subsystem by un-gating the memory I/O power separately from the core power, and bringing the memory I/O out of reset. Platform testing occurs at 228, which can be observed to be after the initiation of the memory subsystem, which can test for shorts or signal crosses in the memory subsystem separately from the core and other parts of the SOC.

In Phase-3 (PH-3), as illustrated at 222, the cores come out of reset. It will be observed how the core comes out of reset after the memory is already out of reset. In Phase-4 (PH-4), the BIOS represents microcode execution to perform system testing and initiation. In diagram 220, the test hardware allows the separate selection of the memory I/O, which allows for a more natural flow of operations for the testing.

Figure 3:
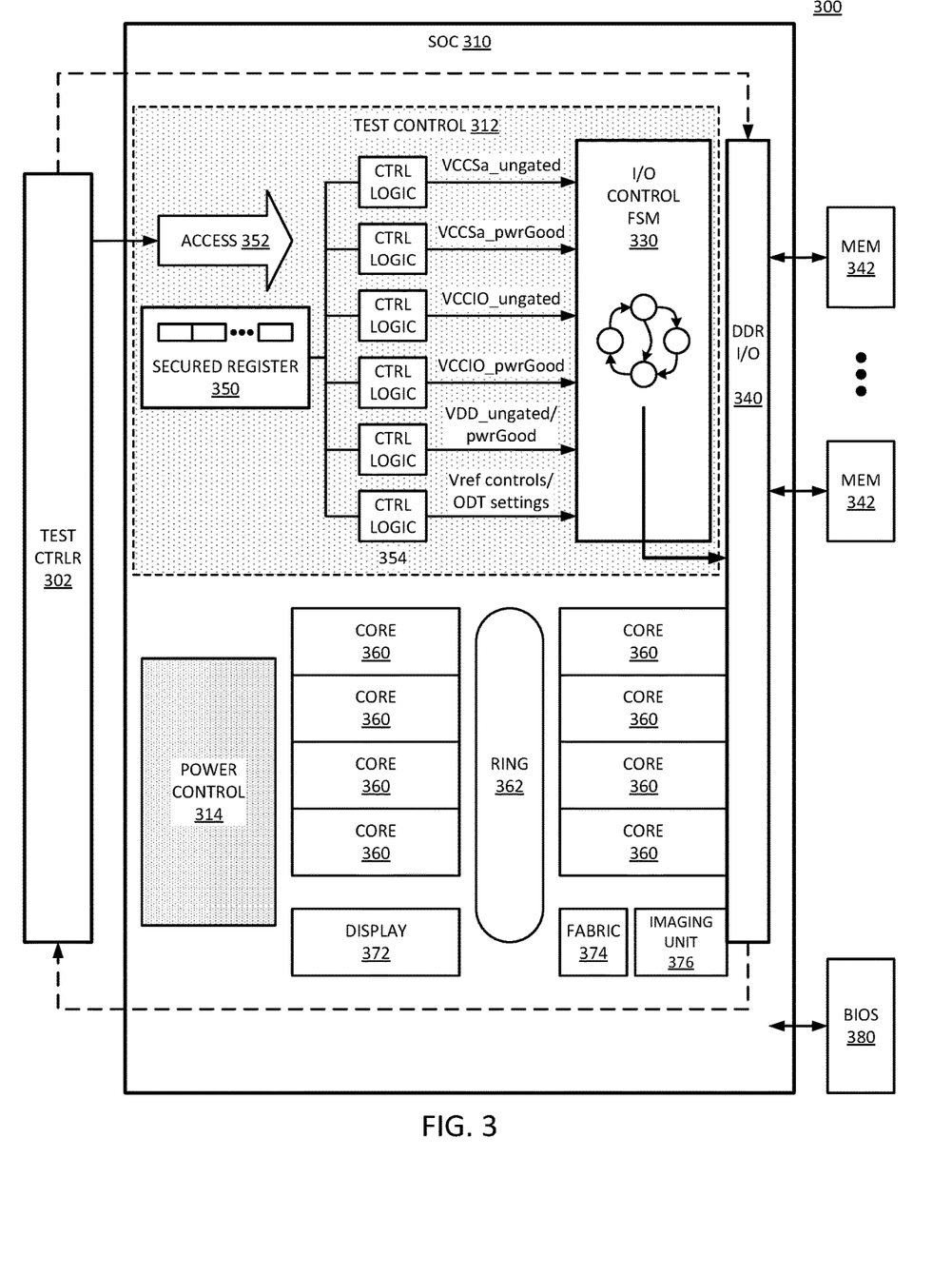
FIG. 3 is a block diagram of an example of a system to perform memory interface testing.

FIG. 3 is a block diagram of an example of a system to perform memory interface testing. System 300 represents elements of a system in accordance with an example of system 100. System 300 provides an example of a system that can execute the testing flow in accordance with diagram 220 of FIG. 2B. System 300 includes SOC 310, which is incorporated on a platform to be tested. SOC 310 can be tested by test controller (CTRLR) 302, which represents a controller of a test system.

In one example, SOC 310 includes multiple cores 360. Cores 360 represent processor cores, and include circuitry to perform processing and execute operations for a computing device. Ring 362 represents a communication or interconnection pathway among cores 360, and access to cache and other resources. In one example, each core 360 includes local cache resources, and SOC 310 includes cache resources that the cores share.

Display 372 represents circuitry to interface with or drive display resources. In one example, display 372 is or includes a GPU or other circuitry to interface with a display device. Fabric 374 represents logic to couple to a network fabric. A network fabric can refer to a connection among multiple computing devices. In one example, SOC 310 includes imaging unit 376, which represents circuitry to provide imaging services to a computing system. The imaging services can enable the processing unit of SOC 310 to natively compute imaging information.

DDR I/O 340 represents circuitry to interface with memory 342. Memory 342 can include DRAM devices, which can be single devices or grouped together such as on a DIMM. In one example, memory 342 includes DDR memory devices. The interface of DDR I/O 340 can include signaling and interconnection circuitry. In one example, DDR I/O 340 includes multiple signal lines to couple memory 342 to cores 360, or cache devices of cores 360. The multiple signals lines of the platform of system 300 can include defects that prevent the proper signaling between memory 342 and cores 360. By checking the connections between DDR I/O 340 and memory 342 separately from booting cores 360, system 300 can better isolate errors within the hardware platform.

In one example, SOC 310 of system 300 includes test control hardware 312, which is in parallel to power control logic 314. Power control 314 represents gating control, power management, and reset control logic of SOC 310. Under normal operating conditions, power control 314 enables the core logic including cores 360, as well as enabling DDR I/O 340.

In one example, SOC 310 includes test control logic 312. Test control 312 represents circuitry or logic to provide a parallel path to enable DDR I/O 340. In a test condition, system 300 can provide the setup for DDR I/O 340 through the dedicated hardware of test control 312. In one example, test control 312 can turn on a test mode. In one example, test control 312 can multiplex or mux in signals from the I/O setup control of I/O control FSM (finite state machine) 330. In one example, the muxing function is controlled in accordance with the mode control.

Test control 312 includes dedicated hardware logic to control the reset of the memory interface. Access 352 represents one or more access mechanisms accessible to test controller 302. The access mechanisms can include registers, buffers, signal lines, or other components. Access 352 enables test controller 302 to trigger the operation of test control 312 and test the interconnection to memory 342. In one example, access 352 is secured to require test control 312 to authenticate test controller 302 prior to accepting input from the test controller. Test control 312 enables the simplification of the test procedure by not requiring elaborate testing through test interconnections or test access points (TAPS) that typically involves long sequences of slow communication. Test control 312 can be in parallel with power control 314 to execute all operations necessary to bring up DDR I/O 340 to a functional state, while reusing the interface access hardware that will be operational in a deployed system.

In one example, test control 312 includes secured register 350. Secured register 350 can be referred to as a "green register", and can require a validated input prior to initiating operation of testing sequences. In one example, an OEM can issue an external instruction to set bits that are written to secured register 350. When the bits written match an expected value or passcode, secured register 350 can cause the execution of various operations, either in response to what is written to authenticate the test access, or in response to a subsequent instruction from test controller 302. Access through secured register 350 does not bring up the core circuitry of SOC 360, but does bring up DDR I/O 340. In one example, test control 312 is enabled in response to test controller 302 writing a specified value to register 350.

Control logic 354 represents logic to enable various voltage signals needed to enable DDR I/O 340 for testing. One or more of the signals can be a voltage rail or a voltage source signal. As non-limiting examples, test control 312 illustrates VCCSa_ungated, VCCSa_pwrGood, VCCIO_ungated, VCCIO_pwrGood, VDD_ungated/pwrGood, and Vref controls/ODT settings. In one example, only a portion of these signals is used. In one example, additional signals are used in addition to those shown, or in place of certain signals illustrated. In one example, control logic 354 provides these signals by decoding information written to secured register 350. In one example, control logic 354 provides the signals by decoding information from access commands received through access 352, or through other registers or buffers not specifically illustrated.

In one example, test control 312 includes I/O control FSM 330, or simply FSM 330. FSM 330 represents an inbuilt hardware FSM to take instructions from outside through the control signals provided by control logic 354, generates a state in response to the input, and selectively enables components of DDR I/O 340 or a memory controller (not specifically illustrated) or both out of a reset sequence. With the memory controller and memory I/O out of reset, test controller 302 can provide input to DDR I/O 340 and issue commands to test control 312 to test the connections to memory 342. In one example, FSM 330 walks through a local reset sequence. Examples of operations in local reset sequencing can include disabling the power gates, enabling power good signals, de-asserting the resets, enabling ODT for low speed operation, setting low speed Rcomp values, selecting Vref voltage at comparator inputs for detecting the incoming voltages levels, or others, or a combination.

Legacy testing is primarily a software operation to provide software instructions through a test port. In one example, test control 312 includes hardware controls that can replace some or all the software testing. In one example, test control 312 provides dedicated hardware inside a chip implemented in SOC 310. Instead of external software, test control 312 can provide firmware instructions, which can operate much more quickly.

As a summary of example implementations of system 300, the system can provide secured access to OEMs to enable memory I/O for board testing. In accordance with system 300, test control 312 can interface with an OEM board control infrastructure as represented by test controller 302. In one example, test control 312 includes a secured access control block, such as register 350, and a hardware FSM or other control logic such as FSM 330. It will be understood that a finite state machine provides one example, but other control logic blocks can alternatively be used. FSM 330 can represent both the FSM structure and the controls to bring DDR I/O 340 out of reset. Once the memory interface is out of reset, in one example, the system can perform board testing/debug and HVM testing on the DDR blocks or on the memory interface components in parallel while the core hardware can be going through a reset.

In one example, test control 312 includes an entire sequence needed to bring the I/O hardware up. Test control 312 can test connections to the DRAMs or DIMMs, such as write (WR) or read (RD) operations, or others. The test connections can be or include connections of various signals of the memory bus, where the memory bus represents I/O signal lines from a memory controller to control access by the core circuitry to memory 342. The test sequence can be specific to an OEM. In one example, after testing the memory I/O for bad connections, system 300 can continue with boot operations, such as memory 342 negotiating with BIOS 380 stored in a storage device off-chip from SOC 310. The memory devices can negotiate with the BIOS and with the memory controller to identify the identity and capabilities of the memory. With system 300, OEMs are able to detect board failures and DIMM connectivity issues to the memory on their site. In one example, FSM 330 operations occur prior to machine reference code (MRC) operations associated with BIOS booting, which enables system 300 to isolate a connectivity issue versus an MRC/BIOS issue.

In one example, test control 312 requires an amount of time on the order of 10 milliseconds (ms) to permit FSM 330 to complete its operation and for power rails to stabilize in response to the issuance of a testing instruction. After completion of the settling time to stabilize the system, in one example, system 300 executes memory connectivity testing and platform board static testing can commence. The testing of system 300 can verify the sanctity of the connections (e.g., capacitance, opens, shorts, or others) from memory 342 to DDR I/O 340.

Power control 314 represents circuitry to enable core processors such as cores 360 and to enable memory interface drivers such as those included in DDR I/O 340. In one example, power control 314 performs the enabling responsive to a reset of SOC 310. The reset can be exiting from a low power state or power cycling of the SOC. SOC 310 also includes test control 312, which can be understood as control logic parallel to power control 314 to enable the memory interface drivers and not the core processor in response to a test routine.

Figure 4:
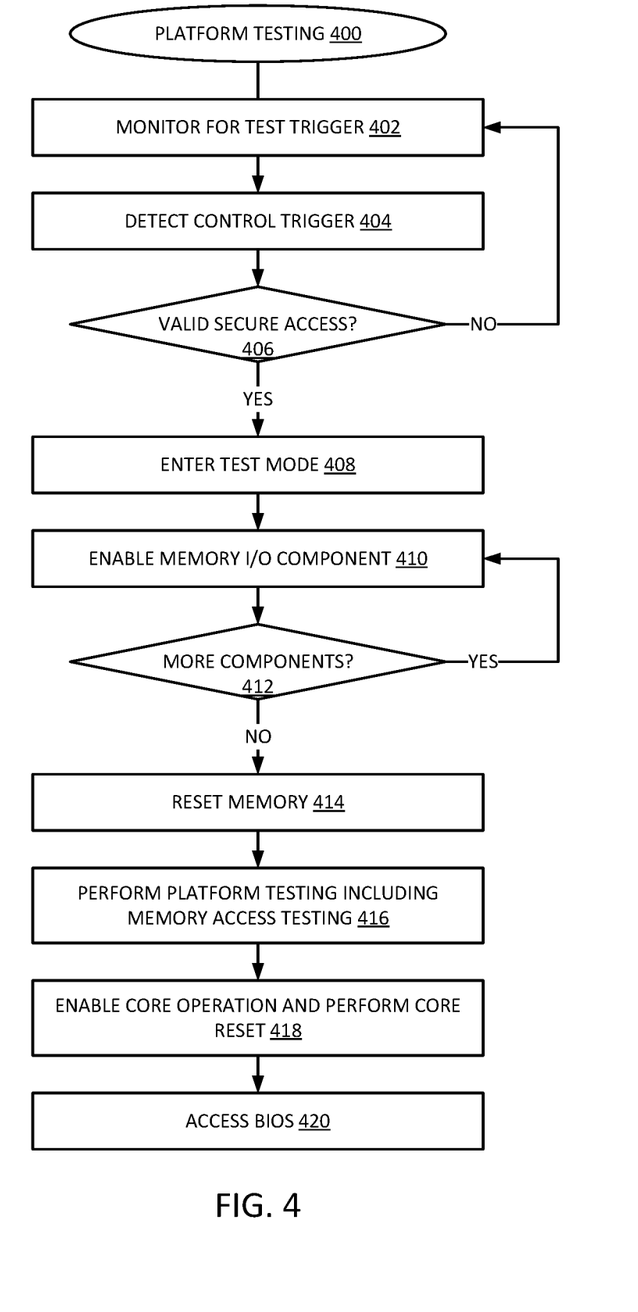
FIG. 4 is a flow diagram of an example of a process for memory I/O testing.

FIG. 4 is a flow diagram of an example of a process for memory I/O testing. Platform testing 400 represents a process for testing a platform that includes a system component that can separately enable the memory I/O from the core circuitry. The platform includes test circuitry that is control circuitry that can selectively enable the memory I/O. In one example, the test control circuitry sits idle most of the time, and monitors a trigger mechanism for a test trigger, 402. The trigger mechanism can be the writing to a register (e.g., detecting a new value written to the register), or other signal such as toggling a signal line in addition to writing a value or sending a serial data word on a signal line.

In one example, the test circuitry detects or receives a control trigger, 404. The control trigger initiates the test circuitry to operate, which will cause it to enable the memory I/O. In one example, the test circuitry can only be enabled when the system is in a test mode, for example, as indicated by a register. In one example, the trigger is secured. For example, a test system may be required to provide a specific preset value to trigger the test control circuitry to initiate. In one example, the secured trigger includes a verification procedure to verify the validity of the trigger. For example, the test control can verify a value written to a register by the test system. If the secure access is not valid, 406 NO branch, the test control can fail to activate, and return to monitoring for a trigger, 402.

If the secure access is valid, 406 YES branch, in one example the SOC or system enters a test mode in response to the trigger, 408. In one example, the SOC is already set into a test mode, and the trigger initiates a test sequence in the mode. The test circuitry can selectively enables a component of the memory I/O in the test mode, 410. In one example, the un-gating of the memory I/O can include enabling I/O circuitry all at once, or in groups of operations. In one example, the un-gating and enabling of the memory I/O includes a sequence of operations to enable different signals in turn. In one example, the test control includes a finite state machine to activate components in sequence. If there are more components to activate, 412 YES branch, the test control can enable another component, 410.

In one example, when there are no more I/O components to activate, 412 NO branch, the system can reset the memory, 414. In one example, the system resets the memory through operation of the test control circuitry. Instead of resetting memory after the reset of the core as traditionally done, the system can perform platform testing including memory access testing separately from core testing, 416. Thus, signal lines and operation of I/O to the memory, and memory interface drivers and receivers can be tested while the core and core processor(s) are still in reset. In one example, the system enables the core operation and performs a core reset after testing the memory I/O, 418. The system can then access the BIOS to execute test routine, 420. In one example, memory I/O testing can occur prior to a boot reset of the core processor.

Figure 5:
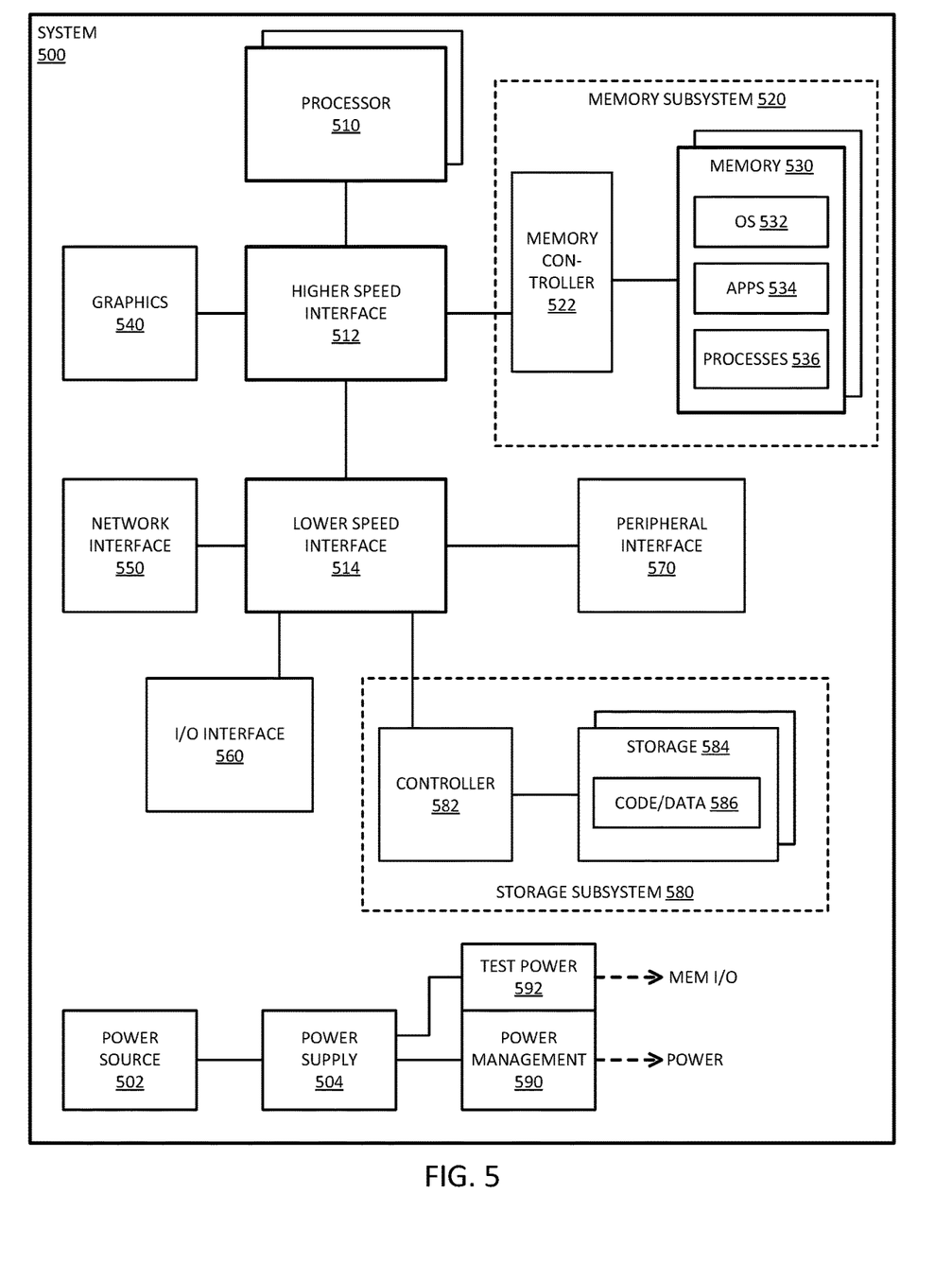
FIG. 5 is a block diagram of an example of a computing system in which a platform with test control circuitry can be incorporated.

FIG. 5 is a block diagram of an example of a computing system in which a platform with test control circuitry can be incorporated. System 500 represents a computing device in accordance with any example herein, and can be a laptop computer, a desktop computer, a tablet computer, a server, a gaming or entertainment control system, embedded computing device, or other electronic device.

In one example, system 500 includes power management 590 to provide power to system 500. In one example, power management 590 includes power control logic to provide gating control and reset control to core circuitry including processor 510 and interface 512. The power control logic also provides gating and reset control to memory controller 522 and the interfaces for memory 530. In one example, system 500 also includes test power control 592, which can be test control in accordance with an example herein. Test power control 592 provides selective enabling of memory I/O for platform testing of a platform in which system 500 is incorporated.

System 500 includes processor 510 can include any type of microprocessor, central processing unit (CPU), graphics processing unit (GPU), processing core, or other processing hardware, or a combination, to provide processing or execution of instructions for system 500. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 500 includes interface 512 coupled to processor 510, which can represent a higher speed interface or a high throughput interface for system components that need higher bandwidth connections, such as memory subsystem 520 or graphics interface components 540. Interface 512 represents an interface circuit, which can be a standalone component or integrated onto a processor die. Interface 512 can be integrated as a circuit onto the processor die or integrated as a component on a system on a chip. Where present, graphics interface 540 interfaces to graphics components for providing a visual display to a user of system 500. Graphics interface 540 can be a standalone component or integrated onto the processor die or system on a chip. In one example, graphics interface 540 can drive a high definition (HD) display that provides an output to a user. In one example, the display can include a touchscreen display. In one example, graphics interface 540 generates a display based on data stored in memory 530 or based on operations executed by processor 510 or both.

Memory subsystem 520 represents the main memory of system 500, and provides storage for code to be executed by processor 510, or data values to be used in executing a routine. Memory subsystem 520 can include one or more memory devices 530 such as read-only memory (ROM), flash memory, one or more varieties of random access memory (RAM) such as DRAM, or other memory devices, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510, such as integrated onto the processor die or a system on a chip.

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 500 includes interface 514, which can be coupled to interface 512. Interface 514 can be a lower speed interface than interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can exchange data with a remote device, which can include sending data stored in memory or receiving data to be stored in memory.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data 586 in a persistent state (i.e., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (i.e., the value or state of the data is indeterminate if power is interrupted to system 500). In one example, storage subsystem 580 includes controller 582 to interface with storage 584. In one example controller 582 is a physical part of interface 514 or processor 510, or can include circuits or logic in both processor 510 and interface 514.

Power source 502 provides power to the components of system 500. More specifically, power source 502 typically interfaces to one or multiple power supplies 504 in system 502 to provide power to the components of system 500. In one example, power supply 504 includes an AC to DC (alternating current to direct current) adapter to plug into a wall outlet. Such AC power can be renewable energy (e.g., solar power) power source 502. In one example, power source 502 includes a DC power source, such as an external AC to DC converter. In one example, power source 502 or power supply 504 includes wireless charging hardware to charge via proximity to a charging field. In one example, power source 502 can include an internal battery or fuel cell source.

Figure 6:
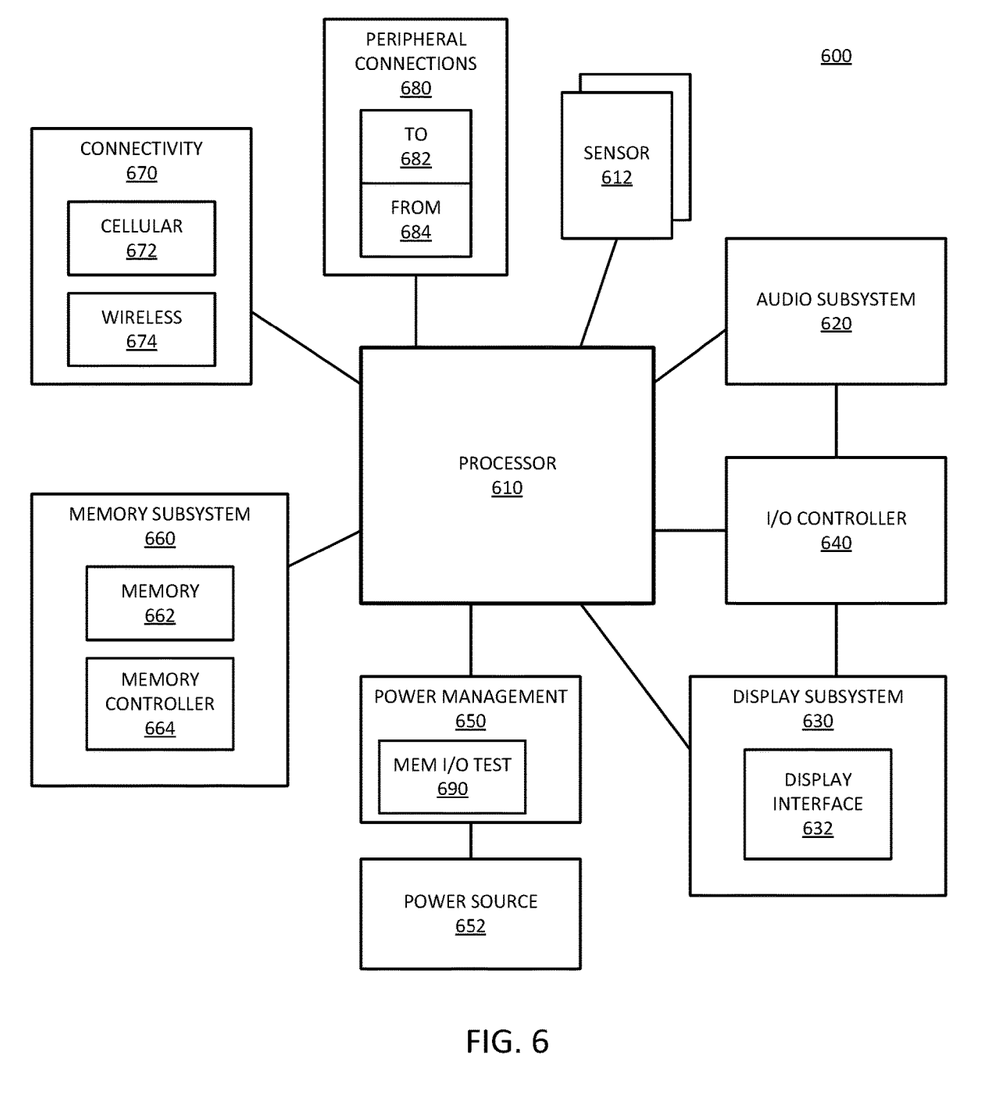
FIG. 6 is a block diagram of an example of a mobile device in which a platform with test control circuitry can be incorporated.

FIG. 6 is a block diagram of an example of a mobile device in which a platform with test control circuitry can be incorporated. Device 600 represents a mobile computing device, such as a computing tablet, a mobile phone or smartphone, wearable computing device, or other mobile device, or an embedded computing device. It will be understood that certain of the components are shown generally, and not all components of such a device are shown in device 600.

In one example, system 600 includes power management 650 to provide power to system 600. While shown connected to processor 610, power management 650 provides power for the other components of system 600 as well, but can be managed by processor 610. In one example, power management 650 includes power control logic to provide gating control and reset control to core circuitry including processor 610 and its interfaces to the other components. The power control logic also provides gating and reset control to memory controller 664 and the interfaces for memory 662. In one example, system 600 also includes memory I/O test power control logic 690, which can be test control in accordance with an example herein. Memory I/O test logic 690 provides selective enabling of memory I/O for platform testing of a platform in which system 600 is incorporated.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and device functions are executed. The processing operations include operations related to I/O (input/output) with a human user or with other devices, operations related to power management, operations related to connecting device 600 to another device, or a combination. The processing operations can also include operations related to audio I/O, display I/O, or other interfacing, or a combination. Processor 610 can execute data stored in memory. Processor 610 can write or edit data stored in memory.

In one example, system 600 includes one or more sensors 612. Sensors 612 represent embedded sensors or interfaces to external sensors, or a combination. Sensors 612 enable system 600 to monitor or detect one or more conditions of an environment or a device in which system 600 is implemented. Sensors 612 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 612 can also include sensors for biometric systems such as fingerprint recognition systems, face detection or recognition systems, or other systems that detect or recognize user features. Sensors 612 should be understood broadly, and not limiting on the many different types of sensors that could be implemented with system 600. In one example, one or more sensors 612 couples to processor 610 via a frontend circuit integrated with processor 610. In one example, one or more sensors 612 couples to processor 610 via another component of system 600.

In one example, device 600 includes audio subsystem 620, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 600, or connected to device 600. In one example, a user interacts with device 600 by providing audio commands that are received and processed by processor 610.

Display subsystem 630 represents hardware (e.g., display devices) and software components (e.g., drivers) that provide a visual display for presentation to a user. In one example, the display includes tactile components or touchscreen elements for a user to interact with the computing device. Display subsystem 630 includes display interface 632, which includes the particular screen or hardware device used to provide a display to a user. In one example, display interface 632 includes logic separate from processor 610 (such as a graphics processor) to perform at least some processing related to the display. In one example, display subsystem 630 includes a touchscreen device that provides both output and input to a user. In one example, display subsystem 630 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. In one example, display subsystem includes a touchscreen display. In one example, display subsystem 630 generates display information based on data stored in memory or based on operations executed by processor 610 or both.

I/O controller 640 represents hardware devices and software components related to interaction with a user. I/O controller 640 can operate to manage hardware that is part of audio subsystem 620, or display subsystem 630, or both. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 or display subsystem 630 or both. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one example, I/O controller 640 manages devices such as accelerometers, cameras, light sensors or other environmental sensors, gyroscopes, global positioning system (GPS), or other hardware that can be included in device 600, or sensors 612. The input can be part of direct user interaction, as well as providing environmental input to the system to influence its operations (such as filtering for noise, adjusting displays for brightness detection, applying a flash for a camera, or other features).

In one example, device 600 includes power management 650 that manages battery power usage, charging of the battery, and features related to power saving operation. Power management 650 manages power from power source 652, which provides power to the components of system 600. In one example, power source 652 includes an AC to DC (alternating current to direct current) adapter to plug into a wall outlet. Such AC power can be renewable energy (e.g., solar power, motion based power). In one example, power source 652 includes only DC power, which can be provided by a DC power source, such as an external AC to DC converter. In one example, power source 652 includes wireless charging hardware to charge via proximity to a charging field. In one example, power source 652 can include an internal battery or fuel cell source.

Memory subsystem 660 includes memory device(s) 662 for storing information in device 600. Memory subsystem 660 can include nonvolatile (state does not change if power to the memory device is interrupted) or volatile (state is indeterminate if power to the memory device is interrupted) memory devices, or a combination. Memory 660 can store application data, user data, music, photos, documents, or other data, as well as system data (whether long-term or temporary) related to the execution of the applications and functions of system 600. In one example, memory subsystem 660 includes memory controller 664 (which could also be considered part of the control of system 600, and could potentially be considered part of processor 610). Memory controller 664 includes a scheduler to generate and issue commands to control access to memory device 662.

Connectivity 670 includes hardware devices (e.g., wireless or wired connectors and communication hardware, or a combination of wired and wireless hardware) and software components (e.g., drivers, protocol stacks) to enable device 600 to communicate with external devices. The external device could be separate devices, such as other computing devices, wireless access points or base stations, as well as peripherals such as headsets, printers, or other devices. In one example, system 600 exchanges data with an external device for storage in memory or for display on a display device. The exchanged data can include data to be stored in memory, or data already stored in memory, to read, write, or edit data.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading, uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a circuit device includes: power control circuitry to enable a core processor and to enable memory interface drivers responsive to a reset; and control logic parallel to the power control circuitry to enable the memory interface drivers and not the core processor in response to a test routine.

In one example, the power control circuitry is to enable the core processor responsive to a secured access trigger. In one example, the secured access trigger comprises a write to a secure register. In one example, the control logic comprises a finite state machine. In one example, the power control circuitry is to enable a memory bus connection for testing. In one example, the control logic is to enable the memory interface drivers prior to enablement of the core processor. In one example, the control logic is to enable the memory interface drivers prior to enablement of a basic input/output system (BIOS). In one example, the control logic is to enable a power supply voltage to test signal lines of a memory interface.

In one example, a system for testing includes: a test controller to generate testing for a computer system circuit board; and a system on a chip (SOC) coupled to the computer system circuit board, the SOC having a circuit in accordance with any example of the preceding two paragraphs. In one example, the system further comprising one or more of: a memory controller incorporated on the SOC; a display communicatively coupled to the SOC; a network interface communicatively coupled to the SOC; or a battery to power the system.

In one example, a method for device testing includes: receiving a testing trigger; initiating, in response to the testing trigger, control logic parallel to power control circuitry of a circuit with a core processor and memory interface drivers; enabling the memory interface drivers with the control logic prior to enabling the core processor; and testing a memory interface prior to enabling the core processor.

In one example, receiving the testing trigger comprises receiving a secured access trigger and verifying security of the access trigger prior to initiating the control logic. In one example, the secured access trigger comprises a write to a secure register. In one example, initiating the control logic comprises initiating a hardware finite state machine. In one example, testing the memory interface comprises testing a memory bus connection on a platform board configured to receive the circuit with the core processor and memory interface drivers. In one example, enabling the memory interface drivers and testing the memory interface are performed prior to a boot reset of the core processor. In one example, enabling the memory interface drivers comprises enabling the memory interface drivers prior to a boot sequence of a basic input/output system (BIOS). In one example, enabling the memory interface drivers comprises un-gating a power supply voltage to perform testing on signal lines of the memory interface drivers.

In one example, an article of manufacture comprising a computer readable storage medium having content stored thereon, which provides instructions to cause a machine to perform operations to execute a method for device testing in accordance with any example of the preceding two paragraphs. In one example, an apparatus comprising means for performing operations to execute a method for device testing in accordance with any example of the preceding two paragraphs.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit device, comprising:
   power control circuitry on an integrated circuit (I/C) to control power gating to provide power to enable a core processor on the I/C and to enable memory interface drivers on the I/C responsive to a reset to bring the I/C out of a state in which the core processor and the memory interface drivers are power gated; and
   control logic on the I/C to control power gating to the memory interface drivers with a power control path to the memory interface drivers parallel to the power control circuitry, the control logic to enable the memory interface drivers and not the core processor in response to a test routine.

2. The circuit device of claim 1, wherein the power control circuitry is to enable the core processor responsive to a secured access trigger.

3. The circuit device of claim 2, wherein the secured access trigger comprises a write to a secure register.

4. The circuit device of claim 1, wherein the control logic comprises a finite state machine.

5. The circuit device of claim 1, wherein the control logic is to enable a memory bus connection for testing.

6. The circuit device of claim 1, wherein the control logic is to enable the memory interface drivers prior to enablement of the core processor.

7. The circuit device of claim 1, wherein the control logic is to enable the memory interface drivers prior to enablement of a basic input/output system (BIOS).

8. The circuit device of claim 1, wherein the control logic is to enable a power supply voltage to test signal lines of a memory interface driven by the memory interface drivers.

9. A system for testing, comprising:
   a test controller to generate testing for a computer system circuit board; and
   a system on a chip (SOC) coupled to the computer system circuit board, the SOC having a circuit including
   power control circuitry on an integrated circuit (I/C) to control power gating to provide power to enable a core processor on the I/C and to enable memory interface drivers on the I/C responsive to a reset to bring the I/C out of a state in which the core processor and the memory interface drivers are power gated; and
   control logic on the I/C to control power gating to the memory interface drivers with a power control path to the memory interface drivers parallel to the power control circuitry, the control logic to enable the memory interface drivers and not the core processor in response to a test routine.

10. The system of claim 9, wherein the power control circuitry is to enable the core processor responsive to a secured access trigger.

11. The system of claim 10, wherein the secured access trigger comprises a write to a secure register.

12. The system of claim 9, wherein the control logic comprises a finite state machine.

13. The system of claim 9, wherein the control logic is to enable a memory bus connection for testing.

14. The system of claim 9, wherein the control logic is to enable the memory interface drivers prior to enablement of the core processor.

15. The system of claim 9, wherein the control logic is to enable the memory interface drivers prior to enablement of a basic input/output system (BIOS).

16. The system of claim 9, wherein the control logic is to enable a power supply voltage to test signal lines of a memory interface driven by the memory interface drivers.

17. A method for device testing, comprising:
   receiving a testing trigger on an integrated circuit (I/C) having power control circuitry to control power gating to provide power to enable a core processor on the I/C and to enable memory interface drivers on the I/C responsive to a reset to bring the I/C out of a state in which the core processor and the memory interface drivers are power gated;
   initiating, in response to the testing trigger, control logic on the I/C to control power gating to the memory interface drivers with a power control path to the memory interface drivers parallel to the power control circuitry;
   enabling the memory interface drivers with the control logic prior to enabling the core processor; and
   testing a memory interface driven by the memory interface drivers prior to enabling the core processor.

18. The method of claim 17, wherein receiving the testing trigger comprises receiving a secured access trigger and verifying security of the access trigger prior to initiating the control logic.

19. The method of claim 17, wherein testing the memory interface comprises testing a memory bus connection on a platform board configured to receive the circuit with the core processor and memory interface drivers.

20. The method of claim 17, wherein enabling the memory interface drivers and testing the memory interface are performed prior to a boot reset of the core processor.

* * * * *